(12) United States Patent
Huang et al.

(10) Patent No.: US 11,864,446 B2
(45) Date of Patent: Jan. 2, 2024

(54) LIGHT EMITTING PANEL AND METHOD FOR MANUFACTURING THE SAME, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xing Huang, Beijing (CN); Yanping Ren, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 407 days.

(21) Appl. No.: 17/415,015

(22) PCT Filed: Jul. 30, 2020

(86) PCT No.: PCT/CN2020/105859
§ 371 (c)(1),
(2) Date: Jun. 17, 2021

(87) PCT Pub. No.: WO2021/018249
PCT Pub. Date: Feb. 4, 2021

(65) Prior Publication Data
US 2022/0069029 A1  Mar. 3, 2022

(30) Foreign Application Priority Data
Jul. 31, 2019 (CN) .......................... 201910702199.5

(51) Int. Cl.
*H10K 59/35* (2023.01)
*H10K 50/844* (2023.01)
(Continued)

(52) U.S. Cl.
CPC ......... *H10K 59/353* (2023.02); *H10K 50/844* (2023.02); *H10K 50/854* (2023.02);
(Continued)

(58) Field of Classification Search
CPC .. H10K 59/353; H10K 50/844; H10K 50/854; H10K 50/856; H10K 50/858;
(Continued)

(56) References Cited

U.S. PATENT DOCUMENTS 8,440,477 B1  5/2013  Lo
2012/0286294 A1  11/2012  Ishizuya
(Continued)

FOREIGN PATENT DOCUMENTS

| CN | 109686868 | 4/2019 |
| CN | 110416432 | 11/2019 |

(Continued)

OTHER PUBLICATIONS

PCT International Search Report (w/ English translation) for corresponding PCT Application No. PCT/CN2020/105859 dated Nov. 3, 2020, 6 pages.
(Continued)

*Primary Examiner* — Joe E. Schoenholtz
(74) *Attorney, Agent, or Firm* — Dority & Manning, P.A.

(57) ABSTRACT

A light-emitting panel has a light-emitting region and a non-light-emitting region, and at least one portion of a boundary of the light-emitting region is zigzag-shaped. The light-emitting panel includes: a base substrate, sub-pixels disposed in the light-emitting region on the base substrate: a first encapsulation layer disposed on a side of the plurality of sub-pixels away from the base substrate, and at least one first barrier wall disposed on the first encapsulation layer. Orthogonal projections of the sub-pixels on the base substrate are within an orthogonal projection of the first encap-
(Continued)

sulation layer on the base substrate. The first barrier wall is located in the non-light-emitting region, and is disposed at a side of the at least one zigzag-shaped portion of the boundary of the light-emitting region proximate to the non-light-emitting region. A refractive index of the first barrier wall is greater than a refractive index of the first encapsulation layer.

20 Claims, 7 Drawing Sheets

(51) Int. Cl.
  *H10K 50/854*   (2023.01)
  *H10K 50/856*   (2023.01)
  *H10K 50/858*   (2023.01)
  *H10K 71/00*    (2023.01)

(52) U.S. Cl.
  CPC ......... *H10K 50/856* (2023.02); *H10K 50/858* (2023.02); *H10K 71/00* (2023.02)

(58) Field of Classification Search
  CPC ........... H10K 71/00; H10K 2102/3026; H10K 50/8428; H10K 50/84
  See application file for complete search history.

(56) References Cited

U.S. PATENT DOCUMENTS

| | | |
|---|---|---|
| 2016/0372701 A1 | 12/2016 | Kwon et al. |
| 2017/0155093 A1 | 6/2017 | Jo |
| 2018/0040854 A1 | 2/2018 | Sung et al. |
| 2018/0157375 A1 | 6/2018 | Han et al. |
| 2018/0337217 A1 | 11/2018 | Zang et al. |
| 2019/0372054 A1 | 12/2019 | Li et al. |
| 2020/0083305 A1 | 3/2020 | Chung |
| 2020/0106053 A1 | 4/2020 | Xiao et al. |
| 2021/0028327 A1* | 1/2021 | Lin ................... H10K 59/38 |
| 2021/0217830 A1 | 7/2021 | Huangfu et al. |

FOREIGN PATENT DOCUMENTS

| | | |
|---|---|---|
| JP | 2012124103 | 6/2012 |
| WO | WO2018130647 | 7/2018 |

OTHER PUBLICATIONS

Chinese First Office Action (w/ English translation) for corresponding CN Application No. 201910702199.5, 16 pages.
Chinese Notification to Grant Patent Right for Invention (w/ English translation) for corresponding CN Application No. 201910702199.5, 8 pages.
Zhou et al., "Directional out-coupling efficiency enhancement of OLED with microlens array films," Journal of Optoelectronics Laser, vol. 21 No. 10, China, Oct. 2010, 14 pages.

* cited by examiner

At least one second barrier wall is formed beside the first encapsulation layer, the second barrier wall is located in the non-light-emitting region, and the second barrier wall is farther away from the light-emitting region than the first barrier wall. The second barrier wall is configured to reflect and/or scatter the light entering the second barrier wall, so that the light is emitted from the light-exit surface of the light-emitting panel ~S500

A second encapsulation layer is formed on a side of the first encapsulation layer and the first barrier wall that is away from the base substrate and between the first barrier wall and the second barrier wall. The refractive index of the second encapsulation layer is greater than the refractive index of the first barrier wall, and is greater than the refractive index of the second barrier wall ~S600

A third encapsulation layer is formed on a side of the second encapsulation layer and the second barrier wall that is away from the base substrate. The orthogonal projections of the second encapsulation layer and the second barrier wall on the base substrate are within the orthogonal projection of the third encapsulation layer on the base substrate, and the refractive index of the third encapsulation layer is less than the refractive index of the second barrier wall ~S700

LIGHT EMITTING PANEL AND METHOD FOR MANUFACTURING THE SAME, AND DISPLAY DEVICE

CROSS-REFERENCE TO RELATED APPLICATIONS

This application is a national phase entry under 35 USC 371 of International Patent Application No. PCT/CN2020/105859, filed on Jul. 30, 2020, which claims priority to Chinese Patent Application No. 201910702199.5, filed on Jul. 31, 2019, which are incorporated herein by reference in their entirety.

TECHNICAL FIELD

The present disclosure relates to the field of display technologies, and in particular, to a light-emitting panel and a method for manufacturing the same, and a display device.

BACKGROUND

Organic light-emitting diodes (abbreviated as OLEDs) have been widely used in display field due to their advantages of high brightness, full viewing angle, fast response speed, flexible display and the like.

SUMMARY

In one aspect, a light-emitting panel is provided. The light-emitting panel has a light-emitting region and a non-light-emitting region on a periphery of the light-emitting region, and at least one portion of a boundary of the light-emitting region is zigzag-shaped. The light-emitting panel includes: a base substrate; a plurality of sub-pixels disposed on a side of the base substrate and located in the light-emitting region; a first encapsulation layer disposed on a side of the plurality of sub-pixels away from the base substrate; and at least one first barrier wall disposed on a side of the first encapsulation layer away from the base substrate. Orthogonal projections of the plurality of sub-pixels on the base substrate are within an orthogonal projection of the first encapsulation layer on the base substrate. The first barrier wall is located in the non-light-emitting region, and is disposed at a side of the at least one zigzag-shaped portion of the boundary of the light-emitting region proximate to the non-light-emitting region. A refractive index of the first barrier wall is greater than a refractive index of the first encapsulation layer. The first barrier wall is configured to guide out light propagating in the first encapsulation layer and scatter the light, so that the scattered light is emitted from a light-exit surface of the light-emitting panel.

In some embodiments, the refractive index of the first barrier wall is in a range of 1.7 to 1.9, and the refractive index of the first encapsulation layer is in a range of 1.6 to 1.7.

In some embodiments, the light-emitting panel further includes a second encapsulation layer disposed on a side of the first barrier wall and the first encapsulation layer that is away from the base substrate. The orthogonal projection of the first encapsulation layer on the base substrate is within an orthogonal projection of the second encapsulation layer on the base substrate. A refractive index of the second encapsulation layer is greater than the refractive index of the first barrier wall.

In some embodiments, the refractive index of the second encapsulation layer is in a range of 1.9 to 2.0.

In some embodiments, the light-emitting panel further includes at least one second barrier wall disposed in the non-light-emitting region and beside the second encapsulation layer. A refractive index of the second barrier wall is less than the refractive index of the second encapsulation layer. The second barrier wall is configured to reflect and/or scatter light entering the second barrier wall, and so that the light is emitted from the light exit surface of the light-emitting panel.

In some embodiments, the refractive index of the second barrier wall is in a range of 1.8 to 1.9.

In some embodiments, the second barrier wall includes a first side face proximate to the light-emitting region and a bottom face proximate to the base substrate, and an included angle between the first side face and the bottom face is in a range of 40° to 60°.

In some embodiments, the at least one zigzag-shaped portion of the boundary of the light-emitting region constitutes at least one step, and the step includes a first step surface and a second step surface. The first barrier wall is in a shape of a column, and the first barrier wall includes a first columnar surface opposite to the first step surface, and a second columnar surface opposite to the second step surface and connected to the first columnar surface. An included angle between the first columnar surface and the second columnar surface is equal to or approximately equal to an included angle between the first step surface and the second step surface.

In some embodiments, the first barrier wall further includes a third columnar surface connected to the first columnar surface and the second columnar surface. The second barrier wall includes a second side face proximate to the light-emitting region, and the second side face is opposite to the third columnar surface.

In some embodiments, a surface of the second barrier wall facing away from the base substrate is higher than a surface of the first barrier wall facing away from the base substrate with respect to the base substrate.

In some embodiments, a thickness of the first barrier wall is in a range of 5 μm to 9 μm. With respect to the base substrate, the surface of the second barrier wall facing away from the base substrate is higher than the surface of the first barrier wall facing away from the base substrate by 1 μm to 7 μm.

In some embodiments, the second barrier wall and the second barrier wall have a distance therebetween.

In some embodiments, the first barrier wall includes a first organic matrix and a plurality of first nano-particles distributed in the first organic matrix. The second barrier wall includes a second organic matrix and a plurality of second nano-particles distributed in the second organic matrix. A particle size of the second nano-particles is greater than a particle size of the first nano-particles, and a distribution density of the second nano-particles is greater than a distribution density of the first nano-particles.

In some embodiments, the particle size of the first nano-particles is in a range of 5 nm to 200 mm, and the particle size of the second nano-particles is in a range of 5 nm to 200 mm. The distribution density of the first nano-particles is in a range of 0.5% wt to 5% wt, and the distribution density of the second nano-particles is in the range of 0.5% wt to 5% wt.

In some embodiments, the light-emitting panel further includes a third encapsulation layer disposed on a side of the second encapsulation layer and the second barrier wall that is away from the base substrate. Orthogonal projections of the second encapsulation layer and the second barrier wall on the base substrate are within an orthogonal projection of the third encapsulation layer on the base substrate. A refractive index of the third encapsulation layer is less than the refractive index of the second barrier wall.

In some embodiments, a refractive index of the third encapsulation layer is in a range of 1.7 to 1.8.

In some embodiments, each sub-pixel includes: a pixel driving circuit disposed between the base substrate and the first encapsulation layer; and a light-emitting device disposed between the pixel driving circuit and the first encapsulation layer and electrically connected to the pixel driving circuit. The light-emitting device includes: a second electrode layer electrically connected to the pixel driving circuit; a light-emitting layer disposed on a side of the second electrode layer away from the pixel driving circuit; and a first electrode layer disposed on a side of the light-emitting layer away from the pixel driving circuit.

In another aspect, a method for manufacturing a light-emitting panel is provided. The light-emitting panel has a light-emitting region and a non-light-emitting region on a periphery of the light-emitting region, and at least one portion of a boundary of the light-emitting region is zigzag-shaped. The manufacturing method includes: providing a base substrate; forming a plurality of sub-pixels on a side of the base substrate; the plurality of sub-pixels being located in the light-emitting region; forming a first encapsulation layer on a side of the plurality of sub-pixels away from the base substrate, orthogonal projections of the plurality of sub-pixels on the base substrate being within an orthogonal projection of the first encapsulation layer on the base substrate; and forming at least one first barrier wall on a side of the first encapsulation layer away from the base substrate and beside the at least one zigzag-shaped portion of the boundary of the light-emitting region, the first barrier wall being located in the non-light-emitting region. A refractive index of the first barrier wall is greater than a refractive index of the first encapsulation layer; and the first barrier wall is configured to guide out light propagating in the first encapsulation layer and scatter the light, so that the scattered light is emitted from a light-exit surface of the light-emitting panel.

In some embodiments, the manufacturing method further includes: forming at least one second barrier wall beside the first encapsulation layer, the second barrier wall being located in the non-light-emitting region and being farther away from the light-emitting region than the first barrier wall, and the second barrier wall being configured to reflect and/or scatter light entering the second barrier wall, so that the light emitted from the light exit surface of the light-emitting panel; and forming a second encapsulation layer on a side of the first encapsulation layer and the first barrier wall that is away from the base substrate and between the first barrier wall and the second barrier wall, a refractive index of the second encapsulation layer being greater than the refractive index of the first barrier wall and being greater than a refractive index of the second barrier wall.

In yet another aspect, a display device is provided. The display device includes the light-emitting panel according to any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below, Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products and actual processes of methods involved in the embodiments of the present disclosure.

DETAILED DESCRIPTION

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, term "comprise" and other forms thereof such as the third-person singular form "comprises" and the present participle form "comprising" throughout the description and the claims are construed as an open and inclusive meaning, i.e., "including, but not limited to". In description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, terms such as "first" and "second" are used for descriptive purposes only, and are not to be construed as indicating or implying the relative importance or implicitly indicating the number of indicated technical features. Thus, features defined as "first" and "second" may explicitly or implicitly include one or more of the features. In the description of the embodiments of the present disclosure, term "a/the plurality of" means two or more unless otherwise specified.

In the description of some embodiments, term "connected" and its derivatives may be used. For example, term "connected" may be used in the description of some embodiments to indicate that two or more components are in direct physical or electric contact with each other. The embodiments disclosed herein are not necessarily limited to the contents herein.

The phrase "A and/or B" includes the following three combinations: only A, only B, and a combination of A and B.

As used herein, term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The use of the phrase "applicable to" or "configured to" herein means an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values other than those stated.

Term "about" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing techniques and/or tolerances may be envisaged. Therefore, the exemplary embodiments should not be construed as being limited to the shapes of regions shown herein, but include deviations in the shapes due to, for example, manufacturing. For example, an etching region shown as a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Figure 1:
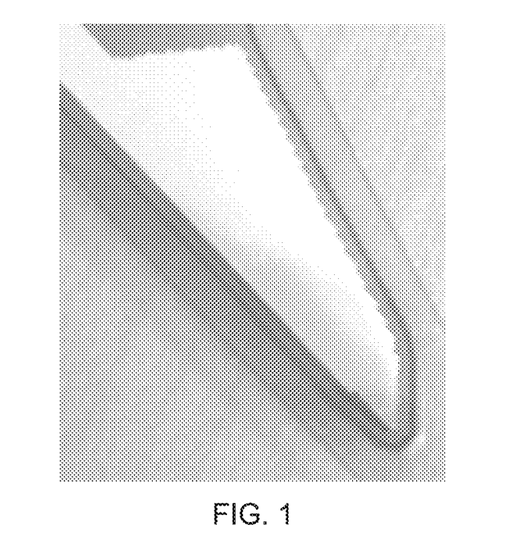
FIG. 1 is a structural diagram of an OLED light-emitting panel in the related art.

OLED light-emitting panels are often required to have high brightness, high uniformity, and high reliability. Therefore, the OLEO light-emitting panels are generally designed to be pixelated to reduce yield loss caused by particles in a manufacturing process. On this basis, each sub-pixel in the OLEO light-emitting panel generally has a large size, which easily causes a problem of sawtooth feeling at edge(s) of the OLED light-emitting panel (as shown in FIG. 1, a middle of the structure shown in FIG. 1 is a light-emitting region), and further affects beauty of the OLED light-emitting panel.

Figure 2:
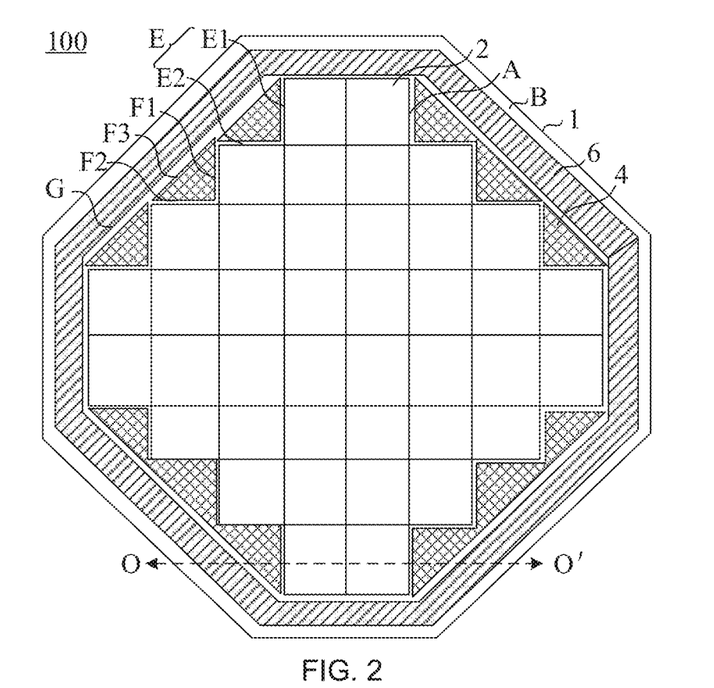
FIG. 2 is a top view of a light-emitting panel, in accordance with some embodiments of the present disclosure.
Figure 3:
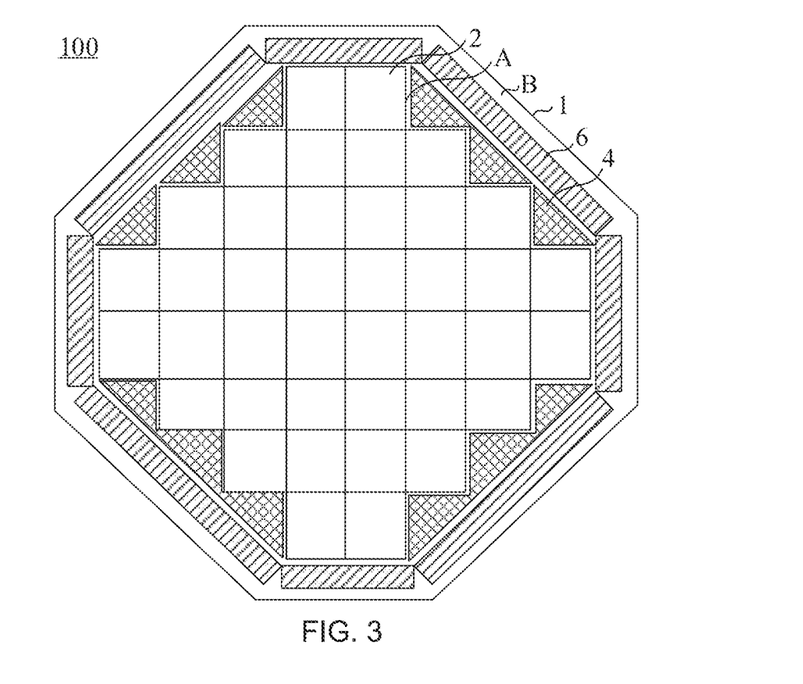
FIG. 3 is a top view of another light-emitting panel, in accordance with some embodiments of the present disclosure.
Figure 4:
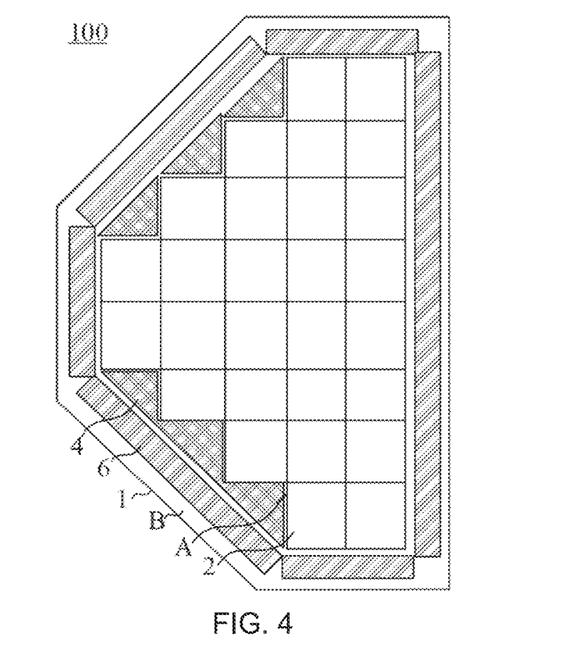
FIG. 4 is a top view of yet another light-emitting panel, in accordance with some embodiments of the present disclosure.

Based on this, some embodiments of the present disclosure provide a light-emitting panel 100. Referring to FIGS. 2 to 7, the light-emitting panel 100 has a light-emitting region A and a non-light-emitting region B on a periphery of the light-emitting region A. For example, the non-light-emitting region B may be located on one side of, two sides of, three sides of, or around, the light-emitting region A (as shown in FIGS. 2 to 4).

In some embodiments, as shown in FIGS. 2 to 7, the light-emitting panel 100 includes a base substrate 1 and a plurality of sub-pixels 2 disposed on a side of the base substrate 1 and located in the light-emitting region A.

A category of the base substrate 1 is various, which may be selectively set according to actual needs.

In some examples, the base substrate 1 includes a rigid base substrate. The rigid base substrate may be, for example, a glass base substrate.

In some other examples, the base substrate 1 includes a flexible base substrate. The flexible base substrate may be, for example, a polyethylene terephthalate (PET) base substrate, a polyethylene naphthalate (PEN) base substrate or a polyimide (PI) base substrate.

An arrangement manner of the plurality of sub-pixels 2 is various, which may be selectively set according to actual needs. For example, the plurality of sub-pixels 2 may be arranged in the manner shown in FIG. 2 or 3. Alternatively, the plurality of sub-pixels 2 may be arranged in the manner shown in FIG. 4.

In some examples, as shown in FIGS. 5 to 9, each sub-pixel 2 includes a pixel driving circuit 21 disposed on a side of the base substrate 1 and a light-emitting device 22 disposed on a side of the pixel driving circuit 21 away from the base substrate 1.

A structure of the pixel driving circuit 21 is various, which may be selectively set according to actual needs. For example, the pixel driving circuit 21 may have a structure of "2T1C", "6T1C", "7T1C", "6T2C", "7T2C" or the like. Here, "T" represents a thin film transistor, and the number before "T" represents the number of thin film transistors. "C" represents a storage capacitor, and the number before "C" represents the number of storage capacitors. One of a plurality of thin film transistors included in the pixel driving circuit 21 is referred to as a driving transistor, and remaining thin film transistors are referred to as switching transistors.

Figure 5:
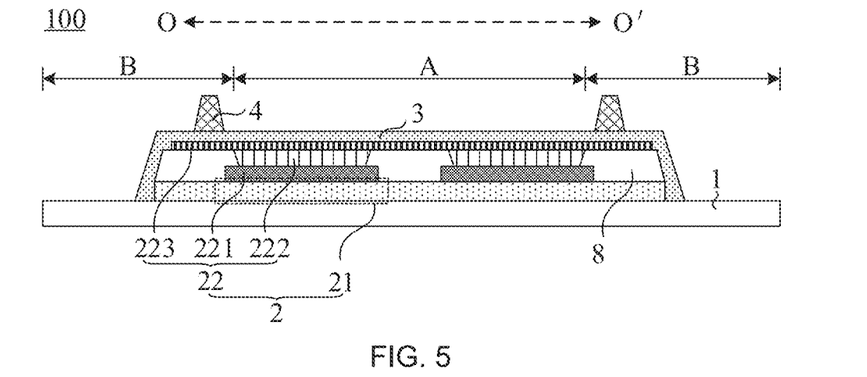
FIG. 5 is a sectional view of a light-emitting panel shown in FIG. 2 taken along the O-O' line.
Figure 6:
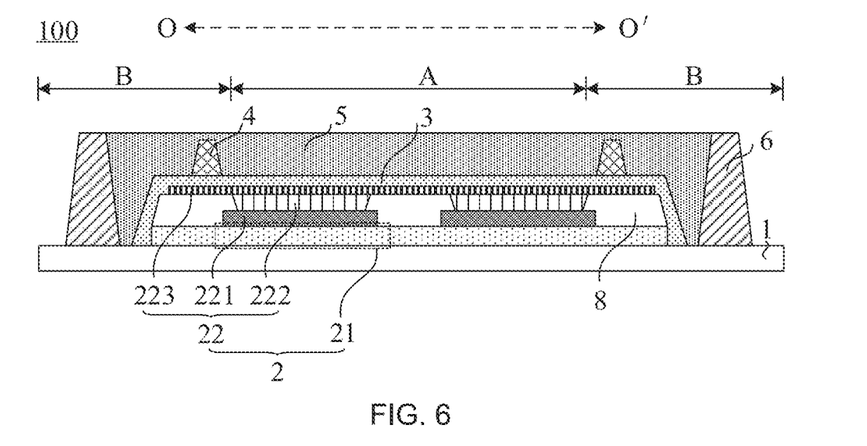
FIG. 6 is a sectional view of another light-emitting panel shown in FIG. 2 taken along the O-O' line.
Figure 7:
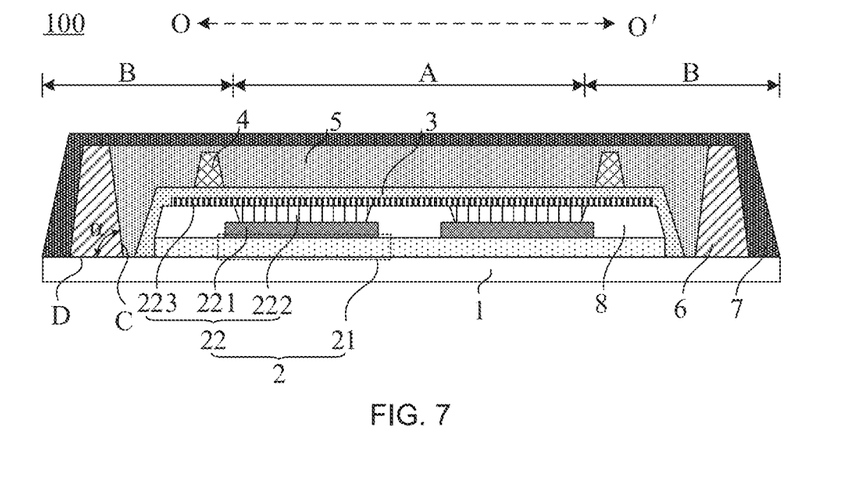
FIG. 7 is a sectional view of yet another light-emitting panel shown in FIG. 2 taken along the O-O' line.

For example, as shown in FIGS. 5 to 7, the light-emitting device 22 includes: a second electrode layer 221 electrically connected to the pixel driving circuit 21, a light-emitting layer 222 disposed on a side of the second electrode layer 221 away from the pixel driving circuit 21, and a first electrode layer 223 disposed on a side of the light-emitting layer 222 away from the pixel driving circuit 21.

The pixel driving circuit 21 can provide a driving voltage to the light-emitting device 22 to drive the light-emitting layer 222 of the light-emitting device 22 to emit light.

Here, for example, first electrode layers 223 of a plurality of light-emitting devices 22 may be connected to one another and may be of a one-piece structure.

It will be noted that, as shown in FIGS. 2 to 4, a boundary of the light-emitting region A is an outer boundary of orthogonal projections of the light-emitting devices 22 in the plurality of sub-pixels 2 on the base substrate 1. Since sub-pixels 2 at edge(s) in the plurality of sub-pixels 2 may be arranged in a step shape, that is, light-emitting devices 22 at the edge may be arranged in a step shape, at least one portion of the boundary of the light-emitting region A is zigzag-shaped.

In some embodiments, as shown in FIGS. 5 to 7, the light-emitting panel 100 further includes a first encapsulation layer 3 disposed on a side of the plurality of sub-pixels 2 away from the base substrate 1.

In some examples, as shown in FIGS. 5 to 7, orthogonal projections of the plurality of sub-pixels 2 on the base substrate 1 are within an orthogonal projection of the first encapsulation layer 3 on the base substrate 1. That is, the first encapsulation layer 3 covers the plurality of sub-pixels 2.

In this way, the first encapsulation layer 3 may be used to encapsulate the plurality of sub-pixels 2 to protect the light-emitting devices 22 in the plurality of sub-pixels 2, and prevent the light-emitting devices 22 from being corroded by oxygen and/or water vapor.

In some embodiments, as shown in FIGS. 5 to 7, the light-emitting panel 100 further includes at least one first barrier wall 4 disposed on a side of the first encapsulation layer 3 away from the base substrate 1. The at east one first barrier wall 4 is located in the non-light-emitting region B, and is arranged at a side of the at least one zigzag-shaped portion of the boundary of the light-emitting region A proximate to the non-light-emitting region B. For example, as shown in FIGS. 2 to 4, the at least one first barrier wall 4 may be located beside step(s) to pad the step(s).

In some examples, the light-emitting panel 100 may include one first barrier wall 4, or may include a plurality of first barrier walls 4. Here, the number of the first barrier wall(s) 4 may be selectively set according to actual needs, which is not limited in the present disclosure.

The at least one first barrier wall 4 is located in the non-light-emitting region B, that is, orthogonal projection(s) of the at least one first barrier wall 4 on the base substrate 1 and the orthogonal projections of the plurality of light-emitting devices 22 on the base substrate 1 do not overlap. In this way, it is possible to prevent the first barrier wall 4 from blocking the light-emitting devices 22, and further avoid affecting forward light exiting from the light-emitting devices 22, and thereby ensuring forward light exit efficiency of the light-emitting panel 100.

In some examples, a refractive index of the first barrier wall 4 is greater than a refractive index of the first encapsulation layer 3. The first barrier wall 4 is configured to guide out light propagating in the first encapsulation layer 3 and scatter the light, so that the scattered light is emitted from a light exit surface of the light-emitting panel 100.

For example, the refractive index of the first barrier wall 4 is in a range of 1.7 to 1.9. For example, the refractive index of the first barrier wall 4 may be 1.7, 1.75, 1.8, 1.88, 1.9 or the like.

For example, the refractive index of the first encapsulation layer 3 is in a range of 1.6 to 1.7. For example, the refractive index of the first encapsulation layer 3 may be 1.6, 1.63, 1.67, 1.7 or the like.

Since the refractive index of the first barrier wall 4 is greater than the refractive index of the first encapsulation layer 3, in a case where the refractive index of the first barrier wall 4 is 1.7, the refractive index of the first encapsulation layer 3 may be any value less than 1.7 between 1.6 and 1.7, and in a case where the refractive index of the first encapsulation layer 3 is 1.7, the refractive index of the first barrier wall 4 may be any value greater than 1.7 between 1.7 and 1.9.

Figure 8:
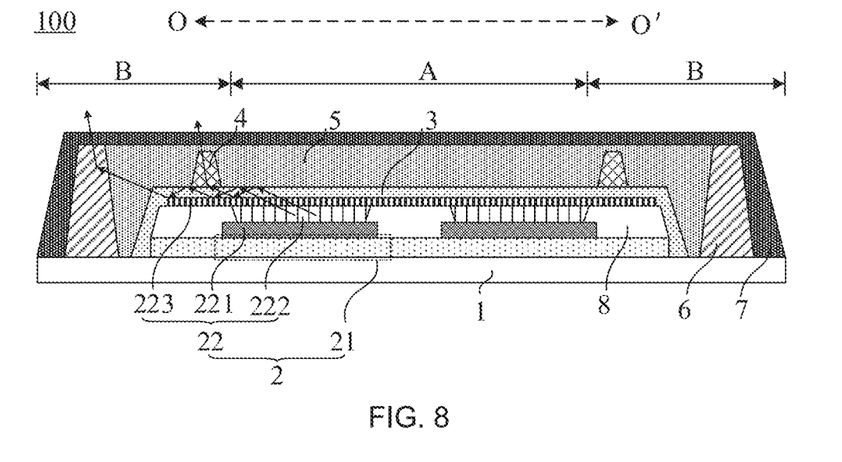
FIG. 8 is an optical path diagram of the structure shown in FIG. 7.
Figure 9:
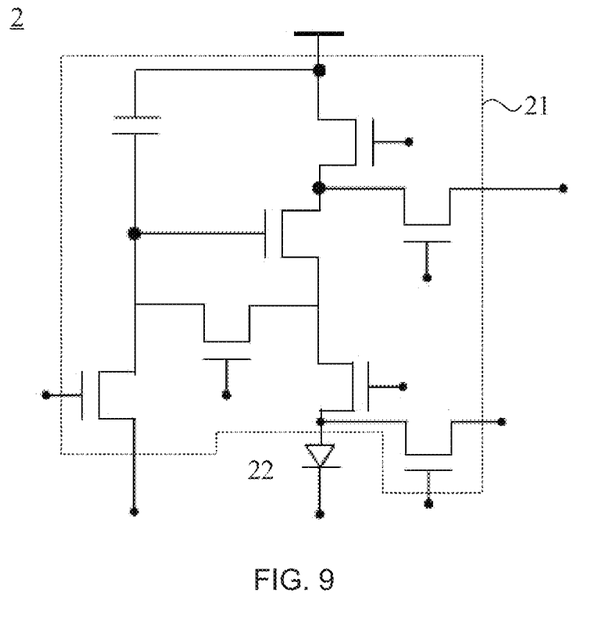
FIG. 9 is an equivalent circuit diagram of a sub-pixel, in accordance with some embodiments of the present disclosure.

During operation of the light-emitting panel 100, as shown in FIG. 8, a part of light emitted by the light-emitting devices 22 is totally reflected in the first encapsulation layer 3. By setting the refractive index of the first barrier wall 4 to be greater than the refractive index of the first encapsulation layer 3, a total reflection condition may be destroyed when a part of light reaches a contact position between the first barrier wall 4 and the first encapsulation layer 3, so that this part of light enters the first barrier wall 4 and is scattered by the first barrier wall 4, and the scattered light is emitted from the light exit surface of the light-emitting panel 100. In this way, light may exit from the first barrier wall 4 that is used to pad the step, so that display continuity at edge of the light-emitting panel 100 may be improved, and sawtooth feeling at the edge of the light-emitting panel 100 may be weakened or even eliminated.

In the light-emitting panel 100 provided in some embodiments of the present disclosure, the first barrier wall 4 is disposed in the non-light-emitting region B, and is arranged at the side of the zigzag-shaped portion of the boundary of the light-emitting region A proximate to the non-light-emitting region B. In this way, it is possible to avoid affecting the forward light exit efficiency of the light-emitting panel 100. Moreover, by setting the refractive index of the first barrier wall 4 to be greater than the refractive index of the first encapsulation layer 3, the first barrier wall 4 may be used to guide out the light propagating in the first encapsulation layer 3 and scatter the light, so that the scattered light is emitted from the first barrier wall 4, which may improve the forward light exit efficiency, increase a display brightness and the display continuity at the edge of the light-emitting panel 100, and effectively improve the problem of sawtooth feeling at the edge of the light-emitting panel 100.

In addition, a decorative film is generally formed on a cover plate of a light-emitting panel to use the decorative film to block light emitted by sub-pixels at an edge of the light-emitting panel, thereby improving the phenomenon of sawtooth feeling at the edge and beautifying an appearance. However, the solution of forming the decorative film on the cover plate easily reduces forward light exit efficiency, has high requirements on alignment accuracy between the cover plate and the sub-pixels, and has a low process integration level since the decorative film and the sub-pixels are separately formed. In some embodiments of the present disclosure, by providing the first barrier wall 4 in the non-light-emitting region B of the light-emitting panel 100, the process integration level may be improved and process difficulty of the light-emitting panel 100 may be reduced based on improving the forward light exit efficiency.

In some embodiments, as shown in FIGS. 6 and 7, the light-emitting panel 100 further includes a second encapsulation layer 5 disposed on a side of the first barrier wall 4 away from the base substrate 1. The orthogonal projection of the first encapsulation layer 3 on the base substrate 1 is within an orthogonal projection of the second encapsulation layer 5 on the base substrate 1. In this case, the second encapsulation layer 5 covers and encapsulates the first encapsulation layer 3 and the first barrier wall 4, so that the second encapsulation layer 5 may be used to further protect the sub-pixels 2.

In some examples, a refractive index of the second encapsulation layer 5 is greater than the refractive index of the first barrier wall 4. That is, the refractive index of the first barrier wall 4 is between the refractive index of the first encapsulation layer 3 and the refractive index of the second encapsulation layer 5.

For example, the refractive index of the second encapsulation layer 5 is in a range of 1.9 to 2.0. For example, the refractive index of the second encapsulation layer 5 may be 0.9, 1.92, 1.95, 1.98, 2.0 or the like.

Here, since the refractive index of the second encapsulation layer 5 is greater than the refractive index of the first barrier wall 4, in a case where the refractive index of the first barrier wall 4 is 1.9, the refractive index of the second encapsulation layer 5 may be any value greater than 1.9 between 1.9 and 2.0, and in a case where the refractive index of the second encapsulation layer 5 is 1.9, the refractive index of the first barrier wall 4 may be any value less than 1.9 between 1.7 and 1.9.

In some examples, the refractive index of the first encapsulation layer 3 may be less than the refractive index of the second encapsulation layer 5.

By controlling the refractive index of the first barrier wall 4 to be greater than the refractive index of the first encapsulation layer 3, and by controlling the refractive index of the first barrier wall 4 to be less than the refractive index of the second encapsulation layer 5, at least a part of the light that is totally reflected in the first encapsulation layer 3 may enter the first barrier wall 4, and exit to an outside of the light-emitting panel 100 after being scattered in the first barrier wall 4, which is conducive to improving a phenomenon of light leakage at the edge of the light-emitting region A and improving the forward light exit efficiency.

In some embodiments, as shown in FIGS. 6 and 7, the light-emitting panel 100 further includes at least one second barrier wall 6 arranged in the non-light-emitting region B and beside the second encapsulation layer 5. That is, the light-emitting panel 100 may include one second barrier wall 6, or may also include a plurality of second barrier walls 6.

In some examples, as shown in FIG. 2, the light-emitting panel 100 includes one second barrier wall 6. The second barrier wall 6 has a loop structure and surrounds the second encapsulation layer 5. That is, the second barrier wall 6 is located on a periphery of the second encapsulation layer 5.

In some other examples, as shown in FIGS. 3 and 4, the light-emitting panel 100 includes a plurality of second barrier walls 6. The plurality of second barrier walls 6 are sequentially arranged to form a loop structure surrounding the second encapsulation layer 5. That is, the second barrier walls 6 are located on the periphery of the second encapsulation layer 5.

In some examples, a refractive index of the second barrier wall 6 is less than the refractive index of the second encapsulation layer 5. The second barrier wall 6 is configured to reflect and/or scatter light entering the second barrier wall 6, so that the light is emitted from the light exit surface of the light-emitting panel 100.

It will be noted that, as shown in FIG. 8, during the operation of the light-emitting panel 100, only a part of the light that is totally reflected in the first encapsulation layer 3 may enter the first barrier wall 4, and the other part of the light continues to propagate and enters the second encapsulation layer 5. After entering the second barrier wall 6, the other part of the light may be reflected and/or scattered, so that the other part of the light may be emitted from the light exit surface of the light-emitting panel 100 under action of the second barrier wall 6. In this way, it is possible to prevent the phenomenon of light leakage from occurring at the edge of the light-emitting panel 100, and further improve the forward light exit efficiency of the light-emitting panel 100, improve the display brightness at the edge of the light-emitting panel 100, and improve the phenomenon of sawtooth feeling at the edge.

For example, the refractive index of the second barrier wall 6 is in a range of 1.8 to 1.9. For example, the refractive index of the second barrier wall 6 may be 1.8, 1.81, 1.86, 1.87, 1.9 or the like.

Herein, since the refractive index of the second barrier wall 6 is less than the refractive index of the second encapsulation layer 5, in a case where the refractive index of the second barrier wall 6 is 1.9, the refractive index of the second encapsulation layer 5 may be any value greater than 1.9 between 1.9 and 2.0, and in a case where the refractive index of the second encapsulation layer 5 is 1.9, the refractive index of the second barrier wall 6 may be any value less than 1.9 between 1.8 and 1.9.

In some examples, as shown in FIG. 7, the second barrier wall 6 includes a first side face C proximate to the light-emitting region A and a bottom face D proximate to the base substrate 1, and an included angle α (a slope angle) between the first side face C and the bottom face D is in a range of 40° to 60°. Here, an included angle between a side face of the second barrier wall 6 away from the light-emitting region A and the bottom face D may also be in a range of 40° to 60°.

Considering that the second barrier wall 6 has an action mechanism of reflecting and/or scattering the light that is emitted from the first encapsulation layer 3, passes through the second encapsulation layer 5 and enters the second barrier wall 6, it is possible to ensure a good light exit effect of the second barrier wall 6 by setting the slope angle α in the range of 40° to 60°.

In the light-emitting panel 100 provided in some embodiments of the present disclosure, by arranging the second barrier wall 6 in the non-light-emitting region B based on arranging the first barrier wall 4, the second barrier wall 6 may be used to scatter and/or reflect a part of light in the first encapsulation layer 3 that is not guided out by the first barrier wall 4, so that the light is emitted from the second barrier wall 6. In this way, it is conducive to further improving the light exit efficiency of the light-emitting panel 100, increasing the brightness at the edge of the light-emitting panel 100, thereby smoothing the edge of the light-emitting panel 100, and improving an effect of improving the sawtooth feeling at the edge.

In some examples, as shown in FIGS. 6 and 7, with respect to the base substrate 1, a surface of the second barrier wall 6 facing away from the base substrate 1 is higher than a surface of the first barrier wall 4 facing away from the base substrate 1.

It will be noted that, in a process of forming the second encapsulation layer 5, for example, the second encapsulation layer 5 may be formed by using an inkjet printing process. In this case, a material of the second encapsulation layer 5 is in a liquid state in the inkjet printing process. By setting heights of the surface of the second barrier wall 6 facing away from the base substrate 1 and the surface of the first barrier wall 4 facing away from the base substrate 1 with respect to the base substrate 1, a buffer region may be formed between the second barrier wall 6 and the first barrier wall 4, so that in a case where the material of the second encapsulation layer 5 is slightly excessive, the buffer region may be used to accommodate the material of the second encapsulation layer 5 to reduce an overflow risk.

In some examples, a thickness (i.e., a dimension of the first barrier wall 4 in a direction perpendicular to the base substrate 1) of the first barrier wall 4 is in a range of 5 μm to 9 μm. With respect to the base substrate 1, the surface of the second barrier wall 6 facing away from the base substrate 1 is higher than the surface of the first barrier wall 4 facing away from the base substrate 1 by 1 μm to 7 μm.

For example, the thickness of the first barrier wall 4 may be 5 μm, 6 μm, 7 μm, 7.6 μm, 8.1 μm, or 9 μm. With respect to the base substrate 1, the surface of the second barrier wall 6 facing away from the base substrate 1 may be higher than the surface of the first barrier wall 4 facing away from the base substrate 1 by 1 μm, 2.2 μm, 3.5 μm, 5 μm, 6 μm or 7 μm.

In some examples, with respect to the base substrate 1, a surface of the second encapsulation layer 5 facing away from the base substrate 1 is flush with the surface of the second barrier wall 6 facing away from the base substrate 1. In this case, with respect to the base substrate 1, the surface of the second encapsulation layer 5 facing away from the base substrate 1 may also be higher than the surface of the first barrier wall 4 facing away from the base substrate 1 by 1 μm to 7 μm.

For example, a thickness of a portion, located on a side of the first encapsulation layer 3 away from the base substrate 1, of the second encapsulation layer 5 may be in a range of 10 μm to 12 μm. For example, the thickness of the portion, located on the side of the first encapsulation layer 3 away from the base substrate 1, of the second encapsulation layer 5 may be 10 μm, 11 μm, 11.3 μm or 12 μm.

In some examples, as shown in FIGS. 2 to 4, there is a distance between the second barrier wall 6 and the first barrier wall 4. That is, the second barrier wall 6 and the first barrier wall 4 are not connected.

Here, a value of the distance between the second barrier wall 6 and the first barrier wall 4 may be determined according to actual conditions, and the value is not limited in the embodiments of the present disclosure.

In some examples, the first barrier wall 4 may include a first organic matrix, and a plurality of first nano-particles distributed in the first organic matrix. For example, the plurality of first nano-particles may be uniformly distributed in the first organic matrix. The second barrier wall 6 may include a second organic matrix, and a plurality of second nano-particles distributed in the second organic matrix.

For example, the light-emitting panel 100 is a top emission light-emitting panel. During the operation of the light-emitting panel 100, a large part (e.g., approximately or greater than 40%) of the light generated by the light-emitting layers 222 in the light-emitting devices 22 cannot be coupled into an ambient environment, and is lost due to internal reflection between the base substrate 1, the electrode layers and the encapsulation layers, and another part (e.g., approximately or greater than 10%) of the light may leak from the edge of the light-emitting panel 100. In the embodiments of the present disclosure, by controlling a material of the first barrier wall 4, for example, by controlling a refractive index of the first organic matrix, and a particle size and a distribution density of the first nano-particles, the first barrier wall 4 may guide out at least a part of the light propagating in the first encapsulation layer 3. By controlling a material of the second barrier wall 6, for example, by controlling a refractive index of the second organic matrix, and a particle size and a distribution density of the second nano-particles, the second barrier wall 6 may scatter and/or reflect the light that is emitted from the first encapsulation layer 3, passes through the second encapsulation layer 5 and enters the second barrier wall 6, thereby further improving the brightness at the edge of the light-emitting panel 100 and eliminating the phenomenon of sawtooth feeling at the edge.

For example, a material of the first organic matrix may include an acrylate material, an epoxy resin material or a polyurethane material, and a refractive index of the material of the first organic matrix may be in a range of 1.5 to 1.9. A material of the second organic matrix may also include an acrylate material, an epoxy resin material or a polyurethane material, and a refractive index of the material of the second organic matrix may be in a range of 1.5 to 1.9.

For example, a material of the first nano-particles may include silver, aluminum or zinc, and the particle size thereof may be in a range of 5 nm to 100 nm. Alternatively, the material of the first nano-particles may be organic montmorillonite, titanium dioxide or silicon dioxide, and the particle size thereof may be in a range of 20 nm to 200 nm. The distribution density of the first nano-particles in the first organic matrix may be in a range of 0.5% wt to 5% wt.

For example, a material of the second nano-particles may include silver, aluminum or zinc, and the particle size thereof may be in a range of 5 nm to 100 nm. Alternatively, the material of the second nano-particles may be organic montmorillonite, titanium dioxide or silicon dioxide, and the particle size thereof may be in a range of 20 nm to 200 nm. The distribution density of the second nano-particles in the second organic matrix may be in the range of 0.5% wt to 5% wt.

In some examples, the refractive index of the second organic matrix may be greater than the refractive index of the first organic matrix, the particle size of the second nano-particles may be greater than that of the first nano-particles, and the distribution density of the second nano-particles may be greater than that of the first nano-particles. This may facilitate the first barrier wall 4 to better guide out and scatter the light propagating in the first encapsulation layer 3, and facilitate the second barrier wall 6 to better reflect and/or scatter the light that is emitted from the first encapsulation layer 3, passes through the second encapsulation layer 5, and enters the second barrier wall 6, thereby improving the light exit efficiency, and improving the phenomenon of sawtooth feeling at the edge.

Shapes of the first barrier wall 4 and the second barrier wall 6 may be various, which may be selectively set according to actual needs.

In some examples, as shown in FIG. 2, the zigzag-shaped portion of the boundary of the light-emitting region A forms at least one step E. That is, the zigzag-shaped portion of the boundary of the light-emitting region A may form one step or a plurality of steps E.

Here, as shown in FIG. 2, each step E includes a first step surface E1 and a second step surface E2. There is an included angle between the first step surface E1 and the second step surface E2.

The first barrier wall 4 may be in a shape of a column. The first barrier wall 4 includes a first columnar surface F1 opposite to a first step surface E1, and a second columnar surface F2 opposite to a second step surface E2 and connected to the first columnar surface F1. An included angle between the first columnar surface F1 and the second columnar surface F2 is equal to or approximately equal to the included angle between the first step surface E1 and the second step surface E2.

This means that a shape of the first barrier wall 4 facing the zigzag-shaped portion of the boundary of the light-emitting region A is matched with the shape of the zigzag-shaped portion of the boundary of the light-emitting region A. For example, as shown in FIG. 2, at the edge of the light-emitting panel 100, the step E is generally adjacent to two sub-pixels 2. By providing the first barrier wall 4 matched with the step E in shape, light emitted from the two adjacent sub-pixels 2 and entering the first encapsulation layer 3 may be sufficiently guided out and scattered by using the first barrier wall 4, so that brightness of light exiting at the step E formed by the two adjacent sub-pixels 2 is greatly increased, and a difference between the brightness of the light exiting at the step E and brightness of the light exiting from the two adjacent sub-pixels 2 themselves is reduced, which may blur boundaries of the sub-pixels 2 observed by a user, and effectively improve the problem of sawtooth feeling at the edge of the light-emitting panel 100.

Based on this, for example, the first barrier wall 4 may be in a shape of a triangular prism, a quadrangular prism, a pentagonal prism, or the like. For another example, the first barrier wall 4 may be in a shape of a truncated triangular pyramid or a truncated quadrangular pyramid.

In addition, as shown in FIG. 2, in a case where the zigzag-shaped portion of the boundary of the light-emitting region A may form a plurality of continuous steps E, a plurality of first barrier walls 4 arranged correspondingly may be independent of one another or may be connected to one another.

The shape of the second barrier wall 6 will be schematically described below by taking an example in which the first barrier wall 4 is in a shape of the triangular prism.

Based on this, as shown in FIG. 2, the first barrier wall 4 further includes a third columnar surface F3 connected to the first columnar surface F1 and the second columnar surface F2. The second barrier wall 6 includes a second side face G proximate to the light-emitting region A, and the second side face G is opposite to the third columnar surface F3. The second barrier wall 6 may be in a shape of, for example, a quadrangular prism shown in FIGS. 3 and 4, or a loop shown in FIG. 2.

In some embodiments, as shown in FIG. 7, the light-emitting panel 100 may further include a third encapsulation layer 7 disposed on a side of the second encapsulation layer 5 and the second barrier wall 6 that is away from the base substrate 1.

In some examples, as shown in FIG. 7, orthogonal projections of the second encapsulation layer 5 and the second barrier wall 6 on the base substrate 1 are within an orthogonal projection of the third encapsulation layer 7 on the base substrate 1. That is, the third encapsulation layer 7 covers and encapsulates the second encapsulation layer 5 and the second barrier wall 6, so that the third encapsulation layer 7 may be used to further protect the sub-pixels 2.

In some examples, a refractive index of the third encapsulation layer 7 is less than the refractive index of the second barrier wall 6. That is, the refractive index of the second barrier wall 6 is between the refractive index of the second encapsulation layer 5 and the refractive index of the third encapsulation layer 7.

By controlling the refractive index of the second barrier wall 6 to be between the refractive index of the second encapsulation layer 5 and the refractive index of the third encapsulation layer 7, the light exiting from the first encapsulation layer 3 and passing through the second encapsulation layer 5 (or referred to as light exiting at the edge) may well enter the second barrier wall 6 and may exit from the light exit surface of the light-emitting panel 100 under the action (i.e., the reflection and/or scattering) of the second barrier wall 6, thereby further improving the light exit efficiency at the edge of the light-emitting panel 100, and effectively reducing loss caused by the light leakage at the edge of the light-emitting panel 100.

For example, the refractive index of the third encapsulation layer 7 is in a range of 1.7 to 1.8. For example, the refractive index of the third encapsulation layer 7 may be 1.7, 1.73, 1.76, 1.78, 1.8 or the like.

Here, since the refractive index of the third encapsulation layer 7 is less than the refractive index of the second barrier wall 6, in a case where the refractive index of the second barrier wall 6 is 1.8, the refractive index of the third encapsulation layer 7 may be any value less than 1.8 between 1.7 and 1.8, and in a case where the refractive index of the third encapsulation layer 7 is 1.8, the refractive index of the second barrier wall 6 may be any value greater than 1.8 between 1.8 and 1.9.

Figure 10:
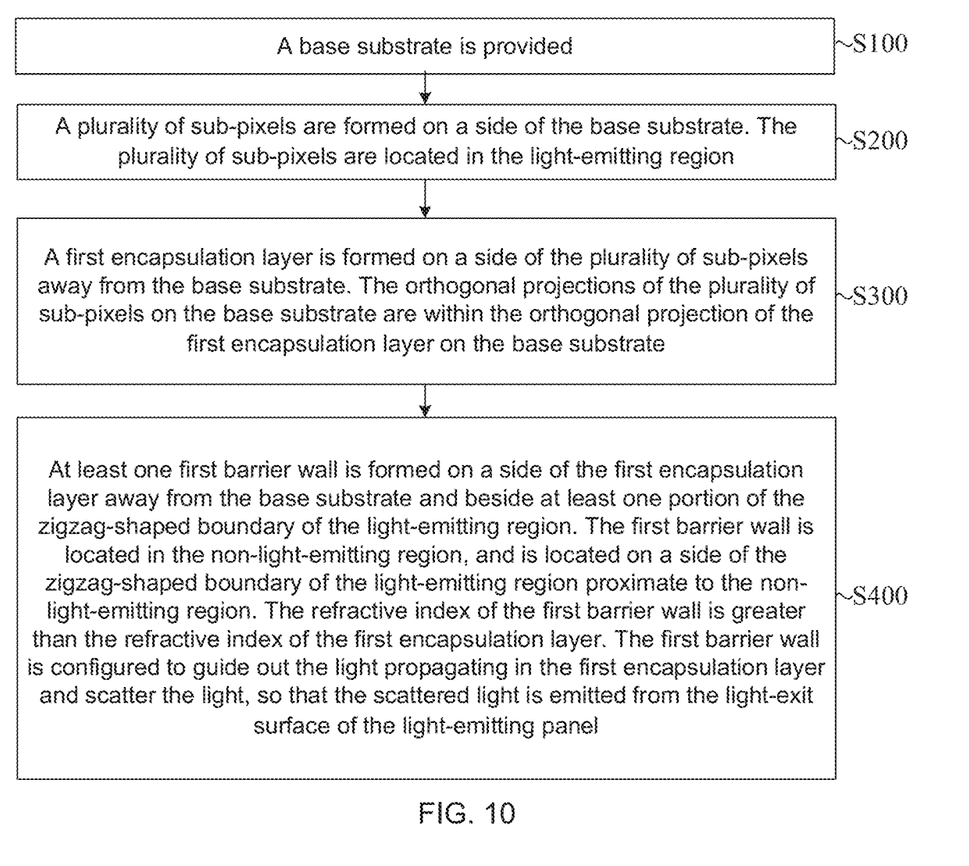
FIG. 10 is a flow diagram of a method for manufacturing a light-emitting panel, in accordance with some embodiments of the present disclosure.

Some embodiments of the present disclosure provide a method for manufacturing a light-emitting panel. The manufacturing method may be used to manufacture the light-emitting panel 100 described in any one of the above embodiments. The light-emitting panel 100 has the light-emitting region A and the non-light-emitting region B on a periphery of the light-emitting region A, and the at least one portion of the boundary of the light-emitting region A is zigzag-shaped. As shown in FIG. 10, the manufacturing method includes S100 to S400.

In S166, a base substrate 1 is provided.

Here, as for the type of the base substrate 1, reference may be made to the description of the base substrate 1 in some embodiments described above, and details will not be repeated herein.

In S200, a plurality of sub-pixels 2 are formed on a side of the base substrate 1. The plurality of sub-pixels 2 are located in the light-emitting region A.

For example, forming the plurality of sub-pixels 2 on the side of the base substrate 1 includes S210 to S250.

In S210, a plurality of pixel driving circuits 21 are formed on the base substrate 1. Each pixel driving circuit 21 includes a plurality of thin film transistors and at least one storage capacitor.

In S220, a second electrode layer 221 (i.e., an anode layer) is formed on a side of each pixel driving circuit 21 away from the base substrate 1.

In S230, a pixel defining layer 8 is formed on a side of the second electrode layers 221 away from the base substrate 1. The pixel defining layer 8 has a plurality of openings, and the plurality of openings expose surfaces of the second electrode layers 221 away from the base substrate 1.

In S240, a plurality of light-emitting layers 222 are formed on the base substrate 1 on which the pixel defining layer 8 has been formed. Each light-emitting layer 222 is located within an opening, or a portion of each light-emitting layer 222 is located within an opening, and a remaining portion thereof overlaps the pixel defining layer 8 on a surface of the pixel defining layer 8 away from the base substrate 1.

In S250, first electrode layers 223 (i.e., cathode layers) are formed on a side of the light-emitting layers 222 away from the base substrate 1.

Here, the second electrode layer 221, the light-emitting layer 222 and the first electrode layer 223 that are sequentially connected constitute a light-emitting device 22. The first electrode layers 223 of the plurality of light-emitting devices 22, for example, may be connected to one another and may form a one-piece structure.

In S300, a first encapsulation layer 3 is formed on a side of the plurality of sub-pixels 2 away from the base substrate 1. The orthogonal projections of the plurality of sub-pixels 2 on the base substrate 1 are within the orthogonal projection of the first encapsulation layer 3 on the base substrate 1.

For example, the first encapsulation layer 3 may be formed on the side of the plurality of sub-pixels 2 away from the base substrate 1 by using low-temperature plasma chemical vapor deposition (abbreviated as PCVD) technology, so as to protect the first electrode layers 223 and the light-emitting layers 222 and other structures by using the first encapsulation layer 3.

In S400, at least one first barrier wall 4 is formed on a side of the first encapsulation layer 3 away from the base substrate 1 and beside at least one zigzag-shaped portion of the boundary of the light-emitting region A. The first barrier wall 4 is located in the non-light-emitting region B, and is located on a side of the zigzag-shaped boundary of the light-emitting region A proximate to the non-light-emitting region B. The refractive index of the first barrier wall 4 is greater than the refractive index of the first encapsulation layer 3. The first barrier wall 4 is configured to guide out light propagating in the first encapsulation layer 3 and scatter the light, so that the scattered light is emitted from the light exit surface of the light-emitting panel 100.

For example, the first barrier wall 4 may be formed by using inkjet printing technology or coating, exposure and development technologies.

It will be noted that, in a case where the first barrier wall 4 is formed by using the inkjet printing technology, after printing is completed, a curing process is needed to enable the first barrier wall 4 to have a stable form.

Here, a type of the curing process may be selected according to the material of the first organic matrix of the first barrier wall 4. For example, the first barrier wall 4 may be cured by using a thermal curing process. In this case, a temperature during the curing process may be in a range of 80° C. to 120° C., and time for the curing process may be in a range of 3 h to 5 h. For example, the first barrier wall 4 may be cured by using a light curing process. In this case, for example, the first barrier wall 4 may be cured for 20 min to 30 min at a temperature of 50° C. by using UV light.

In a case where the first barrier wall 4 is formed by using the coating, exposure and development technologies, a surface treatment may be performed on the first nano-particles to prevent the first nano-particles from agglomerating during coating, so that exposure and development may be performed smoothly, and it is possible to ensure that a thickness of the formed first barrier wall 4 is a needed thickness.

For example, during the surface treatment of the first nano-particles, a polymer surfactant may be added into the first organic matrix to wrap the first nano-particles, so that the first nano-particles can be uniformly and stably distributed in the first organic matrix.

Beneficial effects that can be achieved by the method for manufacturing the light-emitting panel provided in some embodiments of the present disclosure are the same as those that can be achieved by the light-emitting panel 100 provided in some embodiments described above, and details will not be repeated herein.

Figure 11:
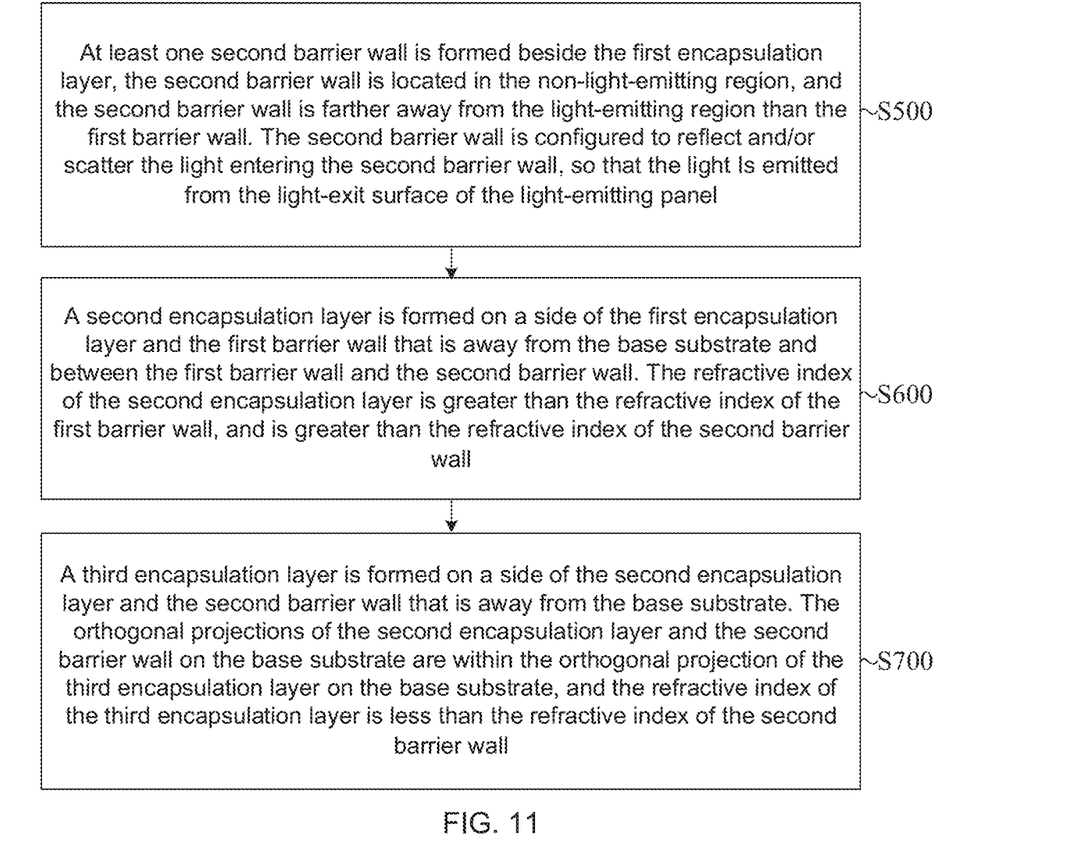
FIG. 11 is a flow diagram of another method for manufacturing a light-emitting panel, in accordance with some embodiments of the present disclosure.

In some embodiments, as shown in FIG. 11, the manufacturing method may further include S500 and S600.

In S500, at least one second barrier wall 6 is formed beside the first encapsulation layer 3, the second barrier wall 6 being located in the non-light-emitting region B and being farther away from the light-emitting region A than the first barrier wall 4. The second barrier wall 6 is configured to reflect and/or scatter light entering the second barrier wall 6, so that the light is emitted from the light exit surface of the light-emitting panel 100.

For example, the second barrier wall 6 may be formed by using an inkjet printing process or coating, exposure and development technologies.

Here, in a case where the second barrier wall 6 is formed by using the inkjet printing process, as for conditions for performing a curing process subsequently, reference may be made to the description of the first barrier wall 4. In a case where the second barrier wall 6 is formed by using the coating, exposure and development technologies, as for a surface treatment of the second nano-particles, reference may be made to the description of the first nano-particles, and details will not be repeated herein.

It will be noted that, in a process of forming the pixel defining layer 8, a portion (which may be referred to as a base portion) of the second barrier wall 6 may be formed in a same patterning process, and then the second barrier wall 6 may be formed by printing less material of the second barrier wall 6 on the base portion by using the inkjet printing process.

In some examples, considering the action mechanism of the second barrier wall 6 on reflecting and/or scattering the light that is emitted from the first encapsulation layer 3, passes through the second encapsulation layer 5, and enters the second barrier wall 6, the slope angle of the second barrier wall 6 may be defined. For example, the slope angle of the second barrier wall 6 may be controlled in a range of 40° to 60°, so that the second barrier wall 6 has a good light exit effect.

For example, in a process of forming the second barrier wall 6 by using the inkjet printing process, a hydrophobic angle of 40° to 60° may be formed by selecting a hydrophobic property of ink (i.e., a material for forming the second barrier wall 6). In a process of forming the second barrier wall 6 by using the coating, exposure and development processes, an angle at which film layer(s) (i.e., film layer(s) formed by the material of the second barrier wall 6) is etched is controlled by controlling the development process, for example, a ratio of physical etching to chemical etching and time for the process may be adjusted, and an appropriate chemical reagent for etching may be selected, so as to form the hydrophobic angle of 40° to 60°.

By forming the second barrier wall 6, the light exit efficiency at the edge of the light-emitting panel 100 may be further improved, the brightness at the edge of the light-emitting panel 100 may be improved, and the phenomenon of sawtooth feeling at the edge may be eliminated.

In S600, a second encapsulation layer 5 is formed on a side of the first encapsulation layer 3 and the first barrier wall 4 that is away from the base substrate 1 and between the first barrier wall 4 and the second barrier wall 6. The refractive index of the second encapsulation layer 5 is greater than the refractive index of the first barrier wall 4, and is greater than the refractive index of the second barrier wall 6.

For example, the second encapsulation layer 5 may be formed on the first encapsulation layer 3 and the first barrier wall 4 and between the first barrier wall 4 and the second barrier wall 6 by using inkjet printing technology. The second barrier wall 6 may limit boundary(s) of the second encapsulation layer 5.

In this step, since the surface of the second barrier wall 6 facing away from the base substrate 1 is higher than the surface of the first barrier wall 4 facing away from the substrate 1 with respect to the base substrate 1, a buffer region may be formed between the second barrier wall 6 and the first barrier wall 4. In the process of forming the second encapsulation layer 5 by using the inkjet printing technology, printed ink (i.e., the material for forming the second encapsulation layer 5) may overflow to the buffer region, thereby avoiding a risk of ink overflow, and enabling the second encapsulation layer 5 to have a good encapsulation effect.

In the manufacturing method provided in some embodiments of the present disclosure, the first barrier wall 4 is formed in the non-light-emitting region B and beside the at least one zigzag-shaped portion of the boundary of the light-emitting region A, and the first barrier wall 4 may be used to guide out and scatter the light propagating in the first encapsulation layer 3, thereby improving the brightness at the edge of the light-emitting panel 100, and achieving an effect of weakening or even eliminating the sawtooth feeling at the edge. On this basis, the second barrier wall 6 is formed on the side of the first barrier wall 4 away from the light-emitting region A, and the second barrier wall 6 may be used to scatter and/or reflect the light that is not guided out by the first barrier wall 4, passes through the second encapsulation layer 5 and enters the second barrier wall 6, thereby further improving the brightness at the edge of the light-emitting panel 100, further smoothing the edge of the light-emitting panel 100, and ensuring the effect of improving the sawtooth feeling at the edge.

In some embodiments, as shown in FIG. 11, the manufacturing method may further include S700.

In S700, a third encapsulation layer 7 is formed on a side of the second encapsulation layer 5 and the second barrier wall 6 that is away from the base substrate 1. The orthogonal projections of the second encapsulation layer 5 and the second barrier wall 6 on the base substrate 1 are within the orthogonal projection of the third encapsulation layer 7 on the base substrate 1, and the refractive index of the third encapsulation layer 7 is less than the refractive index of the second barrier wall 6.

For example, the third encapsulation layer 7 may be formed on the side of the second encapsulation layer 5 and the second barrier wall 6 that is away from the base substrate 1 by using chemical vapor deposition (abbreviated as CVD) technology. The third encapsulation layer 7 covers the second encapsulation layer 5 and the second barrier wall 6, and can serve as a good water-oxygen barrier for the light-emitting devices 22 in the light-emitting region A.

It will be noted that, in the embodiments of the present disclosure, a good flexible encapsulation effect may be achieved by controlling types and thicknesses of encapsulation materials (e.g., a material of the first encapsulation layer 3, a material of the second encapsulation layer 5, and a material of the third encapsulation layer 7). Here, inorganic and organic materials may be selected as the encapsulation material, so that even if the encapsulation layers have large thicknesses, they may still maintain good flexibility; or, the encapsulation layers made of inorganic material(s) may be formed by using atomic layer deposition (abbreviated as ALD) technology to control the thicknesses of the encapsulation layers, so that the encapsulation effect of the encapsulation layers may be achieved with small thicknesses, and the encapsulation layers may maintain good flexibility.

Figure 12:
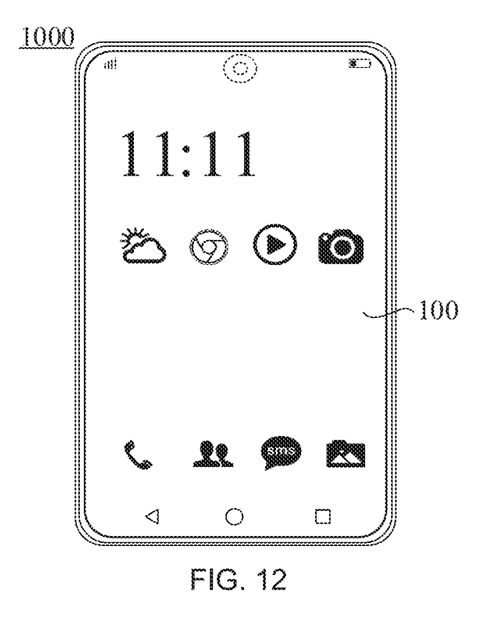
FIG. 12 is a structural diagram of a display device, in accordance with some embodiments of the present disclosure.

Some embodiments of the present disclosure provide a display device 1000. As shown in FIG. 12, the display device 1000 may include the light-emitting panel 100 as described in any one of the above embodiments.

The display device 1000 provided in some embodiments of the present disclosure has same beneficial effects as the light-emitting panel 100 provided in some embodiments of the present disclosure described above, and details will not be repeated herein.

In some embodiments, the display device 1000 may be any product or component with a display function or an illumination function, such as a mobile phone, a tablet computer, a television, a display, a notebook computer, a foldable notebook computer, a digital photo frame, a navigator or a lamp.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting panel having a light-emitting region and a non-light-emitting region on a periphery of the light-emitting region, at least one portion of a boundary of the light-emitting region being zigzag-shaped, the light-emitting panel comprising:
    a base substrate;
    a plurality of sub-pixels disposed on a side of the base substrate and located in the light-emitting region;
    a first encapsulation layer disposed on a side of the plurality of sub-pixels away from the base substrate, orthogonal projections of the plurality of sub-pixels on the base substrate being within an orthogonal projection of the first encapsulation layer on the base substrate; and
    at least one first barrier wall disposed on a side of the first encapsulation layer away from the base substrate, the first barrier wall being located in the non-light-emitting region, and being disposed at a side of the at least one zigzag-shaped portion of the boundary of the light-emitting region proximate to the non-light-emitting region, wherein
    a refractive index of the first barrier wall is greater than a refractive index of the first encapsulation layer; and the first barrier wall is configured to guide out light propagating in the first encapsulation layer and scatter the light, so that the scattered light is emitted from a light exit surface of the light-emitting panel.

2. The light-emitting panel according to claim 1, wherein the refractive index of the first barrier wall is in a range of 1.7 to 1.9, and the refractive index of the first encapsulation layer is in a range of 1.6 to 1.7.

3. The light-emitting panel according to claim 1, further comprising a second encapsulation layer disposed on a side of the first barrier wall and the first encapsulation layer that is away from the base substrate, wherein
    the orthogonal projection of the first encapsulation layer on the base substrate is within an orthogonal projection of the second encapsulation layer on the base substrate; and
    a refractive index of the second encapsulation layer is greater than the refractive index of the first barrier wall.

4. The light-emitting panel according to claim 3, wherein the refractive index of the second encapsulation layer is in a range of 1.9 to 2.0.

5. The light-emitting panel according to claim 3, further comprising at least one second barrier wall disposed in the non-light-emitting region and beside the second encapsulation layer, wherein
    a refractive index of the second barrier wall is less than the refractive index of the second encapsulation layer; and the second barrier wall is configured to reflect and/or scatter light entering the second barrier wall, so that the light is emitted from the light exit surface of the light-emitting panel.

6. The light-emitting panel according to claim 5, wherein the refractive index of the second barrier wall is in a range of 1.8 to 1.9.

7. The light-emitting panel according to claim 5, wherein the second barrier wall includes a first side face proximate to the light-emitting region and a bottom face proximate to the base substrate, and an included angle between the first side face and the bottom face is in a range of 40° to 60°.

8. The light-emitting panel according to claim 5, wherein the at least one zigzag-shaped portion of the boundary of the light-emitting region constitutes at least one step; and the step includes a first step surface and a second step surface; and the first barrier wall is in a shape of a column, and includes a first columnar surface opposite to the first step surface, and a second columnar surface opposite to the second step surface and connected to the first columnar surface; and an included angle between the first columnar surface and the second columnar surface is approximately equal to an included angle between the first step surface and the second step surface.

9. The light-emitting panel according to claim 8, wherein the first barrier wall further includes a third columnar surface connected to the first columnar surface and the second columnar surface; and the second barrier wall includes a second side face proximate to the light-emitting region, and the second side face is opposite to the third columnar surface.

10. The light-emitting panel according to claim 5, wherein a surface of the second barrier wall facing away from the base substrate is higher than a surface of the first barrier wall facing away from the base substrate with respect to the base substrate.

11. The light-emitting panel according to claim 10, wherein a thickness of the first barrier wall is in a range of 5 μm to 9 μm; and with respect to the base substrate, the surface of the second barrier wall facing away from the base substrate is higher than the surface of the first barrier wall facing away from the base substrate by 1 μm to 7 μm.

12. The light-emitting panel according to claim 5, wherein the second barrier wall and the first barrier wall have a distance therebetween.

13. The light-emitting panel according to claim 5, wherein the first barrier wall includes a first organic matrix and a plurality of first nano-particles distributed in the first organic matrix; and the second barrier wall includes a second organic matrix and a plurality of second nano-particles distributed in the second organic matrix, wherein a particle size of the second nano-particles is greater than a particle size of the first nano-particles, and a distribution density of the second nano-particles is greater than a distribution density of the first nano-particles.

14. The light-emitting panel according to claim 13, wherein the particle size of the first nano-particles is in a range of 5 nm to 200 mm, and the particle size of the second nano-particles is in a range of 5 nm to 200 mm; and the distribution density of the first nano-particles is in a range of 0.5% wt to 5% wt, and the distribution density of the second nano-particles is in the range of 0.5% wt to 5% wt.

15. The light-emitting panel according to claim 5, further comprising a third encapsulation layer disposed on a side of the second encapsulation layer and the second barrier wall that is away from the base substrate, wherein orthogonal projections of the second encapsulation layer and the second barrier wall on the base substrate are within an orthogonal projection of the third encapsulation layer on the base substrate; and a refractive index of the third encapsulation layer is less than the refractive index of the second barrier wall.

16. The light-emitting panel according to claim 15, wherein the refractive index of the third encapsulation layer is in a range of 1.7 to 1.8.

17. The light-emitting panel according to claim 1, wherein each sub-pixel includes:

a pixel driving circuit disposed between the base substrate and the first encapsulation layer; and a light-emitting device disposed between the pixel driving circuit and the first encapsulation layer and electrically connected to the pixel driving circuit, wherein the light-emitting device includes:

a second electrode layer electrically connected to the pixel driving circuit;

a light-emitting layer disposed on a side of the second electrode layer away from the pixel driving circuit; and a first electrode layer disposed on a side of the light-emitting layer away from the pixel driving circuit.

18. A method for manufacturing a light-emitting panel, the light-emitting panel having a light-emitting region and a non-light-emitting region on a periphery of the light-emitting region, and at least one portion of a boundary of the light-emitting region being zigzag-shaped, the method comprising:

providing a base substrate;

forming a plurality of sub-pixels on a side of the base substrate, the plurality of sub-pixels being located in the light-emitting region;

forming a first encapsulation layer on a side of the plurality of sub-pixels away from the base substrate, orthogonal projections of the plurality of sub-pixels on the base substrate being within an orthogonal projection of the first encapsulation layer on the base substrate; and forming at least one first barrier wall on a side of the first encapsulation layer away from the base substrate and beside the at least one zigzag-shaped portion of the boundary of the light-emitting region, the first barrier wall being located in the non-light-emitting region, wherein a refractive index of the first barrier wall is greater than a refractive index of the first encapsulation layer; and the first barrier wall is configured to guide out light propagating in the first encapsulation layer and scatter the light, so that the scattered light is emitted from a light exit surface of the light-emitting panel.

19. The method according to claim 18, further comprising:

forming at least one second barrier wall beside the first encapsulation layer, the second barrier wall being located in the non-light-emitting region and being farther away from the light-emitting region than the first barrier wall, wherein the second barrier wall is configured to reflect and/or scatter light entering the second barrier wall so that the light is emitted from the light exit surface of the light-emitting panel; and forming a second encapsulation layer on a side of the first encapsulation layer and the first barrier wall away from the base substrate and between the first barrier wall and the second barrier wall, a refractive index of the second encapsulation layer being greater than the refractive index of the first barrier wall and being greater than a refractive index of the second barrier wall.

20. A display device, comprising the light-emitting panel according to claim 1.

* * * * *